US006188563B1

United States Patent
Green

(10) Patent No.: US 6,188,563 B1
(45) Date of Patent: Feb. 13, 2001

(54) PLATEN FOR SEMICONDUCTOR WORKPIECES

(75) Inventor: Gordon Robert Green, Thornbury (GB)

(73) Assignee: Trikon Equipments Limited, Gwent (GB)

( * ) Notice: Under 35 U.S.C. 154(b), the term of this patent shall be extended for 0 days.

(21) Appl. No.: 09/152,673

(22) Filed: Sep. 14, 1998

(30) Foreign Application Priority Data

Sep. 18, 1997 (GB) .................................... 9719764

(51) Int. Cl.[7] .................................... H02N 13/00
(52) U.S. Cl. .................................... 361/234
(58) Field of Search .................. 361/230–235; 279/128

(56) References Cited

U.S. PATENT DOCUMENTS

| | | | |
|---|---|---|---|
| 5,103,367 | * 4/1992 | Horwitz et al. | 361/234 |
| 5,151,845 | * 9/1992 | Watanabe et al. | 361/234 |
| 5,325,261 | * 6/1994 | Horwitz | 361/234 |
| 5,708,557 | * 1/1998 | Feigenbaum et al. | 361/234 |
| 5,886,863 | * 3/1999 | Nagasaki et al. | 361/234 |

FOREIGN PATENT DOCUMENTS

| | | |
|---|---|---|
| 0 692 814 A1 | 8/1996 | (EP) . |
| 0725 427 A2 | 8/1996 | (EP) . |
| WO 88/09054 A1 | 11/1998 | (WO) . |

OTHER PUBLICATIONS

IBM–TDB Oct. 1989, Double–sided electrostatic chuck, Oct. 1989.*

* cited by examiner

Primary Examiner—Ronald W. Leja
(74) Attorney, Agent, or Firm—Jones Volentine, LLC

(57) ABSTRACT

A Platen, generally indicated at (10), comprises a ceramic body (11) and a workpiece support surface (12) and a base (13). Embodied within the body (11) are an electrostatic chuck electrode (40), an RF electrode (15), a heater (16), a ground plane electrode (17), an embedded thermocouple (18), and a stainless steel support (19). This combination provides a platen which can be RF driven, but has a screen to prevent unwanted plasma beneath the platen. The chuck can also be utilized as an electrostatic chuck.

14 Claims, 2 Drawing Sheets

PLATEN FOR SEMICONDUCTOR WORKPIECES

This invention relates to a platen for supporting a semiconductor workpiece for processing.

It is well-known to use platens for supporting semiconductor workpieces and, in recent years, many such supports have been configured as what are known as electrostatic chucks. These use an electrode or electrodes, which are generally separated from the support surface of the platen by a layer of dielectric, to create an electrostatic charge which serves to clamp the workpiece to the chuck.

In many semiconductor processing arrangements, it is desirable to supply radio frequency signals to the platen and this has previously been achieved using metallic platens.

From one aspect the invention consists in a platen for supporting a semiconductor workpiece for processing comprising, an insulating (for example ceramic) body having an upper workpiece support surface and a base; an RF electrode disposed in the body between the support surface and the base and extending generally parallel thereto and a ground plane electrode disposed in the body between the RF electrode and the base.

The existence of an RF electrode in the platen enables the construction of an RF driven platen, which can be totally integrated with an electrostatic chuck. Indeed, if the platen is an electrostatic chuck, then the electrostatic electrode may also constitute an RF electrode. Alternatively, if the body incorporates a heating element, then that element may additionally constitute the RF electrode.

In this latter arrangement the temperature sensor may be disposed in the body and additionally, or alternatively, the body may have voids or tubes extending therethrough to allow cooling of the body.

The provision of the ground plane enables the RF to be screened from the bottom of the platen, preventing an unwanted plasma from being created beneath the platen. This increases the efficiency of the RF drive and reduces the risk of workpiece contamination.

It may be advantageous to have at least a portion of the base open or absent to expose the ground plane. This would enable an electrical connection to be formed directly with the ground plane. If the connector is tubular other connections may pass through it without having to pass through the associated vacuum chamber.

Alternatively, an electrical contact in the ground plane may be disposed at the peripheral edge of the platen and may extend circumjacent thereto. In this case the body above ground plane may be less wide than the remainder to expose the portion of the ground plane and hence to allow the electrical contact to sit on the exposed portion.

A similar arrangement may be provided to form an electrical contact for the RF electrode. In that case the body above the RF electrode would be less wide than the remainder to expose a portion of the RF electrode and hence to allow the electrical contact to sit on the exposed portion.

The body may further define or contain an inlet for process gas which debouches at the peripheral edge of the body.

Although the invention has been defined above, it is to be understood that it includes any of the features set out above or in the following description.

The invention may be performed in various ways and a specific embodiment will now be described, by way of example, with reference to the accompanying drawings in which.

Figure 1:
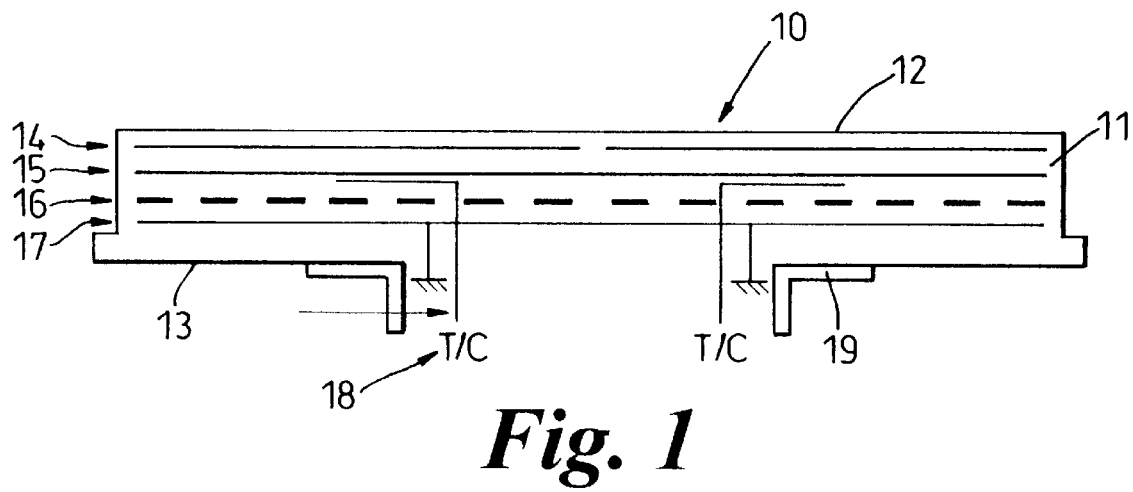
FIG. 1 is a vertical cross-sectional view from a platen.

A platen generally indicated at 10 comprises a ceramic body 11 having a workpiece support surface 12 and a base 13. Embodied within the body 11 are an electrostatic chuck electrode 14 and RF electrode 15, a heater 16, a ground plane electrode 17, an embedded thermocouple 18 and a stainless steel support 19.

As has been described above, this basic combination of features provides a platen which can be RF driven but has a screen to prevent unwanted plasma beneath the platen, and which can also be utilised as a electrostatic chuck. Because the features of the platen are embedded in the body 11, the platen 10 can be used in a wide range of environmental conditions, (for example, in processing conditions from milliTorr to Torr), whilst providing good electrostatic chuck performance and high temperature uniformity. The electrodes are also well protected from usual processing gases.

Typically, the platen may be operated at a temperature of 600° C., with an-RF power of around 400 watts at 13.56 MHz and with a DC bias of around 400 volts.

Figure 2:
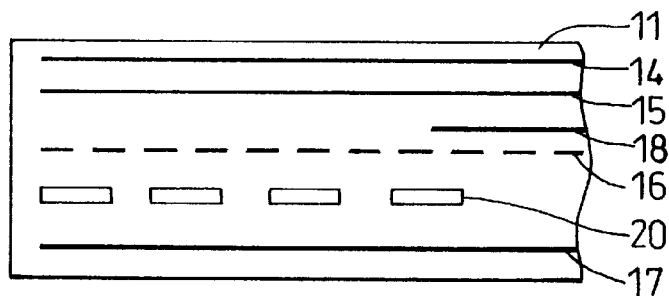
FIG. 2 is an enlarged portion of an alternative construction.

Turning to FIG. 2, cooling galleries 20 may be provided in the body to enhance temperature control. The cooling fluid may be compressed air or some other suitable fluid.

Figure 3:
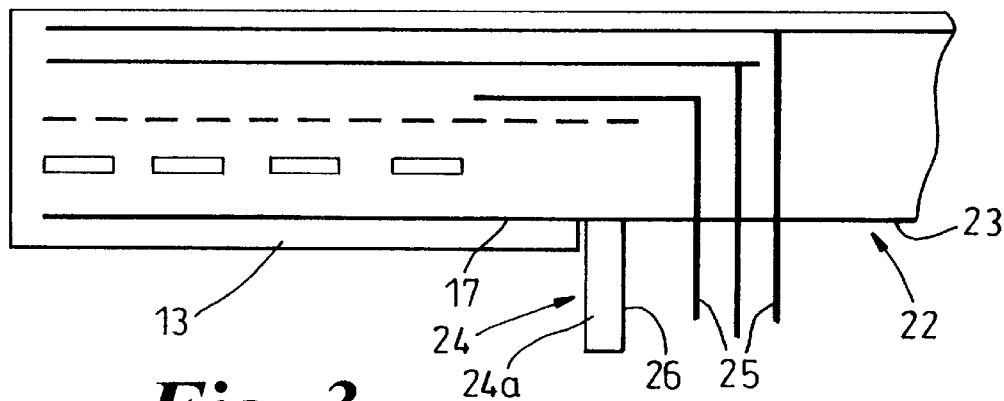
FIG. 3 is a corresponding view to FIG. 2 but showing additional features.

In FIG. 3, a central portion of the base 13 is cut away at 22 to expose a portion 23 of the ground plane 17 to enable the earth connection 24 to be formed by a stainless steel (or other suitable material) tubular pedestal 24a to which the ground plane 17 may be brazed. This would provide a vacuum seal and mechanical fixing and would allow electrical connection 25 to pass through the open middle 26 of the pedestal 24a. The middle 26 may be at atmosphere and may also contain the compressed air feed to the galleries 20.

Figure 4:
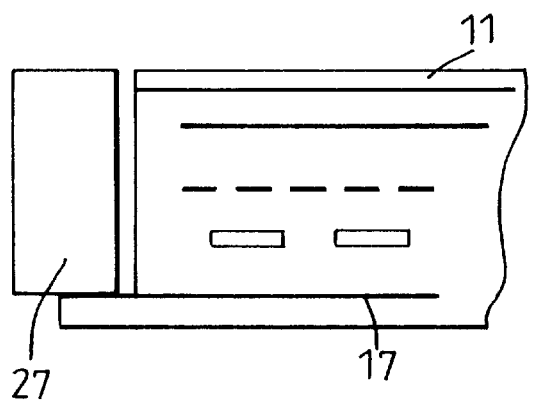
FIG. 4 is a further alternative illustrating a ground plane connection.

FIG. 4 illustrates how a similar kind of connection can be made to the ground plane at the periphery of the body 11. Here the upper part of the body 11 is less wide than the remainder and so has to expose a portion or annulus of the ground plane 17. The electrical connection 27, which could be part of the chamber, can then engage the ground plane 17 and may be pressed thereto.

Figure 5:
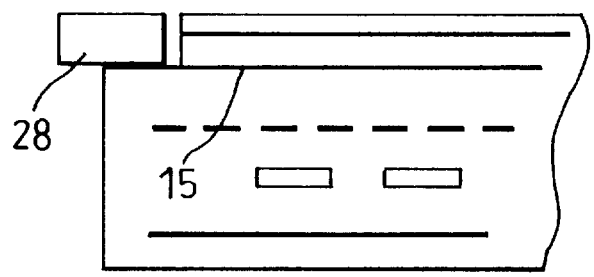
FIG. 5 is a still further alternative illustrating an RF connection.

In FIG. 5 the electrode 28 is connected to the RF electrode 15 in a similar manner.

Figure 6:
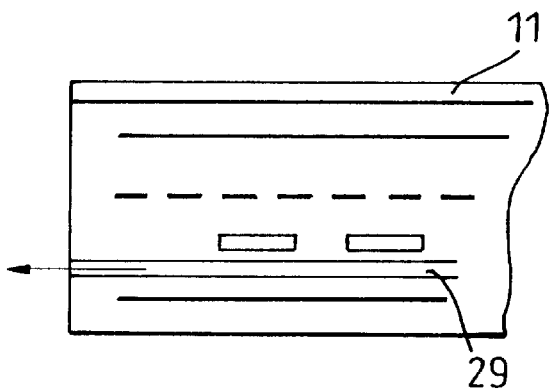
FIG. 6 is a further section showing a processing gas inlet arrangement.

Finally, in FIG. 6, the body 11 is shown having a process gas inlet 29 which debouches at the periphery of the body 11 to allow process gas to pass up the edge of the platen. Once more the feed could pass through the space 26.

What is claimed is:

1. A platen for supporting a semiconductor workpiece for processing, said platen comprising an electrically insulating body having an upper workpiece support surface and a base; an RF electrode disposed in the body between the support surface and the base and extending generally parallel thereto; and a ground plane electrode disposed in the body between the RF electrode and the base.

2. A platen as claimed in claim 1, wherein the platen is an electrostatic chuck with an electrostatic electrode.

3. A platen as claimed in claim 2, wherein the electrostatic electrode also constitutes the RF electrode.

4. A platen as-claimed in claim 1, wherein the body incorporates a heating element.

5. A platen as claimed in claim 4, wherein the heating element constitutes the RF electrode.

6. A platen as claimed in claim 4, further comprising a temperature sensor disposed in the body.

7. A platen as claimed in claim 1, wherein the body has voids or tubes extending therethrough to allow cooling of the body.

8. A platen as claimed in claim 1, wherein at least portion of the base is open or absent to expose the ground plane electrode.

9. A platen as claimed in claim 8, wherein an electrical connection to the ground plane electrode is made directly to an exposed area by a tubular connector through which other connections may pass.

10. A platen as claimed in claim 1, wherein an electrical contact for the RF electrode is disposed at the peripheral edge of the platen.

11. A platen as claimed in claim 10, wherein the body above the RF electrode is less wide than the remainder to expose a portion of the RF electrode to allow the electrical contact to sit on the exposed platen.

12. A platen as claimed in claim 1, wherein the body defines or contains an inlet for process gas, which debouches at the peripheral edge of the body.

13. A platen for supporting a semiconductor workpiece for processing, said platen comprising an electrically insulating body having an upper workpiece support surface and a base; an RF electrode disposed in the body between the support surface and the base and extending generally parallel thereto; and a ground plane electrode disposed in the body between the RF electrode and the base, wherein an electrical contact for the ground plane electrode is disposed at the peripheral edge of the platen.

14. A platen for supporting a semiconductor workpiece for processing, said platen comprising an electrically insulating body having an upper workpiece support surface and a base; an RF electrode disposed in the body between the support surface and the base and extending generally parallel thereto; and a ground plane electrode disposed in the body between the RF electrode and the base, wherein an electrical contact for the ground plane electrode is disposed at the peripheral edge of the platen, and wherein the body above the ground plane electrode is less wide than the remainder to expose a portion of the ground plane electrode to allow the electrical contact to sit on the exposed portion.

* * * * *